United States Patent
Zhang et al.

(10) Patent No.: US 10,902,971 B2
(45) Date of Patent: *Jan. 26, 2021

(54) CONDUCTIVE PASTE FOR SEMICONDUCTOR DEVICE AND PREPARATION METHOD

(71) Applicant: Soltrium Advanced Materials Technology, Ltd, Shenzhen (CN)

(72) Inventors: Jie Zhang, Shenzhen (CN); Xiaoli Liu, Shenzhen (CN); Fengzhen Sun, Shenzhen (CN); Delin Li, San Jose, CA (US)

(73) Assignee: Sobtrium Advanced Materials Technology, Ltd., Shenzhen ( * ) Notice: Subject to any disclaimer, the term of this patent is extended or adjusted under 35 U.S.C. 154(b) by 0 days.

This patent is subject to a terminal disclaimer.

(21) Appl. No.: 16/840,344

(22) Filed: Apr. 4, 2020

(65) Prior Publication Data

US 2020/0286642 A1 Sep. 10, 2020

Related U.S. Application Data

(63) Continuation of application No. 16/297,620, filed on Mar. 9, 2019, now Pat. No. 10,658,090.

(51) Int. Cl.
*H01L 31/0216* (2014.01)
*H01L 31/0224* (2006.01)
(Continued)

(52) U.S. Cl.
CPC ......... *H01B 1/22* (2013.01); *H01L 31/02168* (2013.01); *H01L 31/022425* (2013.01);
(Continued)

(58) Field of Classification Search
CPC ............... H01L 31/1804; H01L 31/068; H01L 31/022425; H01L 31/02168;
(Continued)

(56) References Cited

U.S. PATENT DOCUMENTS 5,855,820 A * 1/1999 Chan ........................ C09D 5/24
252/511
9,847,437 B1 * 12/2017 You ................. H01L 31/022425
(Continued)

*Primary Examiner* — Golam Mowla
(74) *Attorney, Agent, or Firm* — Fang Wu

(57) ABSTRACT

A front-side conductive paste for a crystalline silicon solar cell chip is provided. The front-side conductive paste for a crystalline silicon solar cell chip includes, in parts by weight, 80.0-93.0 parts of a metal powder, 6.0-15.0 parts of an organic carrier, and 1.0-5.0 parts of an oxide etching agent. The oxide etching agent contains at least 10-40% of MgO, 0.1-5% of PbO, and 5-30% of $Li_2O$ based on 100% by mole, with the molar ratio of MgO:PbO being 10:5~40:0.1, and the mole ratio of MgO:$Li_2O$ being 10:30~40:5. The metal powder forms good ohmic contact with crystalline silicon substrate during the sintering process of the front-side conductive paste applied overlying an insulation film on the substrate. Finally, a front-side electrode of low contact resistance, good electrical conductivity, and strong adhesion is obtained.

20 Claims, 4 Drawing Sheets

(51) Int. Cl.
*H01L 31/18* (2006.01)
*H01L 31/068* (2012.01)
*H01B 1/22* (2006.01)
*B22F 7/08* (2006.01)

(52) U.S. Cl.
CPC ........ *H01L 31/068* (2013.01); *H01L 31/1804* (2013.01); *B22F 7/08* (2013.01); *B22F 2301/255* (2013.01)

(58) Field of Classification Search
CPC ........... C22C 32/0015; B22F 2301/255; B22F 1/0059; B22F 7/08
See application file for complete search history.

(56) References Cited

U.S. PATENT DOCUMENTS

| | | | | |
|---|---|---|---|---|
| 2003/0119653 A1* | 6/2003 | Tanaka | ...................... | C03C 8/04 501/79 |
| 2006/0009343 A1* | 1/2006 | Fechner | ................ | H01J 61/302 501/65 |
| 2006/0272700 A1* | 12/2006 | Young | ...................... | C03C 8/18 136/256 |
| 2006/0273287 A1* | 12/2006 | Young | ...................... | H01B 1/22 252/500 |
| 2009/0104457 A1* | 4/2009 | Carroll | ...................... | H01B 1/16 428/434 |
| 2009/0104461 A1* | 4/2009 | Young | ...................... | C03C 8/14 428/447 |
| 2009/0120490 A1* | 5/2009 | Huang | ...................... | H01B 1/22 136/252 |
| 2009/0301554 A1* | 12/2009 | Konno | ...................... | C03C 8/04 136/252 |
| 2010/0096014 A1* | 4/2010 | Iida | .......................... | H01B 1/16 136/265 |
| 2010/0126565 A1* | 5/2010 | Takeda | ...................... | C03C 8/18 136/252 |
| 2010/0308462 A1* | 12/2010 | Konno | ...................... | C03C 8/02 257/741 |
| 2010/0317143 A1* | 12/2010 | Laudisio | ......... | H01L 31/022425 438/72 |
| 2011/0094584 A1* | 4/2011 | Sawada | .................... | C03C 3/097 136/256 |
| 2011/0146776 A1* | 6/2011 | Carroll | .................... | H01B 1/16 136/256 |
| 2011/0309312 A1* | 12/2011 | Sugiyama | ................ | H01B 1/22 252/514 |
| 2012/0305065 A1* | 12/2012 | Dorfman | ......... | H01L 31/022433 136/256 |
| 2013/0000714 A1* | 1/2013 | Ittel | ........................ | C03C 3/07 136/256 |
| 2013/0098431 A1* | 4/2013 | Chen | ........................ | H01B 1/22 136/252 |
| 2013/0119326 A1* | 5/2013 | Hamada | .................. | C03C 3/066 252/519.52 |
| 2013/0203206 A1* | 8/2013 | Umeda | ........... | H01L 31/022425 438/72 |
| 2014/0220732 A1* | 8/2014 | Liu | ........................ | H01L 31/18 438/98 |
| 2014/0239238 A1* | 8/2014 | Tsunoda | ......... | H01L 31/022425 252/514 |
| 2014/0352778 A1* | 12/2014 | Yang | ...................... | C03C 3/072 136/256 |
| 2014/0373909 A1* | 12/2014 | Zhang | ...................... | C03C 8/08 136/256 |
| 2015/0007881 A1* | 1/2015 | Khadilkar | ......... | H01L 31/02167 136/256 |
| 2016/0163892 A1* | 6/2016 | Yeh | ................ | H01L 31/022466 136/256 |
| 2016/0163893 A1* | 6/2016 | Yeh | ........................ | C03C 3/062 136/256 |
| 2017/0301804 A1* | 10/2017 | Hang | ............. | H01L 31/022425 |
| 2018/0346371 A1* | 12/2018 | Moyer | ...................... | C03C 8/18 |

\* cited by examiner

CONDUCTIVE PASTE FOR SEMICONDUCTOR DEVICE AND PREPARATION METHOD

CROSS-REFERENCES TO RELATED APPLICATIONS

This application is a continuation of and claims priority to U.S. patent application Ser. No. 16/297,620 filed Mar. 9, 2019, which claims priority to PCT Patent Application No. PCT/CN2018/081374, filed on Mar. 30, 2018, commonly assigned and incorporated by reference herein to its entirety for all purposes.

BACKGROUND OF THE INVENTION

The present invention relates to the technical field of solar cells, and particularly, to a front-side conductive paste for a crystalline silicon solar cell, a method of using the front-side conductive paste to form a first-side electrode therefor, and a crystalline silicon solar cell chip having the same.

Solar energy is an inexhaustible and clean energy source. With the depletion of non-renewable energy sources such as coal and petroleum, the development and utilization of solar energy has become a hot spot. Solar cells developed based on this idea are an important means of utilizing solar energy. At present, the industrialized crystalline silicon solar cell has become a model for use of solar cells.

Cell chip is a core component in the crystalline silicon solar cell. In order to collect and guide the current generated under illumination, an electrode needs to be fabricated respectively on each of a front side and a back side of the cell chip. There are various methods available for manufacturing electrodes. Among them, screen printing and co-sintering are a currently most common production process. For example, in the manufacture of front-side electrodes, a conductive paste is applied to a silicon cell chip by screen printing, and a front-side electrode is formed on the front side of the silicon cell chip by sintering. The sintered front-side electrode of the crystalline silicon solar cell needs to be firmly adhered onto the silicon cell chip, has narrow and high grid lines and small light shielding area, and is easy to be soldered. The conductive paste for the front-side electrode of the silicon solar cell is required to have the ability to penetrate a silicon nitride anti-reflective film during the sintering process, to form a good ohmic contact with the silicon cell chip.

A common front-side conductive paste for the crystalline silicon solar cell contains a silver powder, an oxide etching agent, and an organic carrier, and the conductive paste is printed on the solar cell followed by sintering to form a front-side electrode. During the sintering process, an oxide etching agent in the conductive paste etches and penetrates an anti-reflective insulating layer such as silicon nitride, titanium oxide, aluminum oxide, silicon oxide, or silicon oxide/titanium oxide on the front side or the side of irradiation of the crystalline silicon solar cell, so that the silver powder is brought into contact with the substrate of the crystalline silicon solar cell to form a front-side electrode. In order to increase the conversion efficiency of the silicon solar cell chip, the sheet resistance of the solar cell chip is increased the conventional front-side conductive paste and the oxide etching agent used cannot well etch the anti-reflective insulating layer on the surface of the silicon solar cell chip. As a result, the adhesion of the front-side electrode formed on solar cell chip surface is decreased, and the contact resistance between the front-side electrode formed and the surface of the silicon solar cell chip is high, thus not only affecting the photoelectric conversion efficiency of the silicon solar cell chip but also the reliability of the solar cell chip in the field application.

BRIEF SUMMARY OF THE INVENTION

The technical problem to be solved by the present invention is to provide a front-side conductive paste for a crystalline silicon solar cell and a preparation method therefor, to solve the problem that the existing front-side conductive paste cannot effectively etch the anti-reflective insulating layer on a surface of a silicon solar cell chip having high sheet resistance, causing a decreased adhesion of the front-side electrode formed on solar cell chip surface as well as an increased contact resistance between the front-side electrode and the surface of the silicon chip, which not only lowered photoelectric conversion efficiency of the silicon chip but also its reliability in the field application.

Further, the present invention also provides a method for fabricating a front-side electrode of a crystalline silicon solar cell and a silicon solar cell having the front-side electrode. To achieve the above object, the following technical solution is adopted in the present invention.

In an aspect, the present disclosure provides a front-side conductive paste for a crystalline silicon solar cell chip. The conductive paste includes, based on 100 parts by weight, metal powder 80.0-93.0 parts, organic carrier 6.0-15.0 parts, and oxide etching agent 1.0-5.0 parts. Wherein the oxide etching agent comprises PbO, MgO, $Li_2O$, and the mole ratio of MgO:PbO is 10:5~40:0.1, and the mole ratio of MgO:$Li_2O$ is 10:30~40:5, and the PbO content is 0.1~5% based on 100 parts by mole.

In another aspect, the present disclosure provides a method for preparing a front-side conductive paste for a crystalline silicon solar cell chip. The method includes a step S01 of melting raw material components of an oxide etching agent to obtain a melted oxide etching agent, a step of quenching the melt to obtain a particulate oxide etching agent, and a step of crushing to obtain a powdered oxide etching agent having a particle size ranging from 0.1 to 5.0 µm. Additionally, the method includes a step S02 of mixing raw materials of an organic carrier in an environment of 40-100° C., to obtain the organic carrier. Furthermore, the method includes a step S03 of mixing a metal powder with the powdered oxide etching agent and the organic carrier, to obtain a front-side conductive paste for a crystalline silicon solar cell chip.

In yet another aspect, the present disclosure provides a method for fabricating a front-side electrode of a crystalline silicon solar cell chip. The method includes at least the steps of providing a crystalline silicon substrate having an insulating film overlaid on its surface, printing a front-side conductive paste for a crystalline silicon solar cell chip as described above on a surface of the insulating film, then drying, sintering, and cooling to obtain a front-side electrode of a crystalline silicon solar cell chip.

In addition, a crystalline silicon solar cell chip is provided. The crystalline silicon solar cell chip has a front-side electrode as described above. The crystalline silicon solar cell chip includes a crystalline silicon substrate and at least one insulation film overlaid on the crystalline silicon substrate. The crystalline silicon solar cell chip further includes a front-side electrode in contact with the at least one insulation film and in electrical contact with the crystalline silicon substrate.

Compared with the prior art, the front-side conductive paste for a crystalline silicon solar cell chip provided in the present invention has the following advantages. The oxide etching agent contains components of PbO, MgO, $Li_2O$ with specific molar ratio ranges exhibiting excellent dissolving and etching properties. Therefore, the oxide etching agent can dissolve a sufficient amount of silver during the sintering process. One portion of the liquid oxide etching agent in which the silver is dissolved is to wet the metal powder and facilitate the sintering of the metal powder. The other portion of the liquid oxide etching agent flows to the surface of the solar cell chip and reacts with the anti-reflective layer, so that the anti-reflective layer is effectively etched. During the cooling process, the silver dissolved in the liquid oxide etching agent is precipitated out to form fine silver nanoparticles, which allows the metal powder to form an excellent ohmic contact with silicon. Thus, the contact resistance of the front-side electrode with the silicon solar cell can be greatly reduced and the adhesion of the front-side electrode on silicon solar cell is increased at the same time. This greatly improves the reliability of the silicon solar cell chip deployed in the field. Finally, a front-side electrode with low contact resistance, good electrical conductivity and strong adhesion is obtained.

The method for preparing a front-side conductive paste for a crystalline silicon solar cell chip provided in the present invention has simple process conditions, and the obtained front-side conductive paste has uniform components and superior performance, and is suitable for mass industrial production.

The method for preparing a front-side electrode of a crystalline silicon solar cell chip provided in the present invention has the following advantages. The front-side conductive paste for a crystalline silicon solar cell chip provided above is employed, and the oxide etching agent used for the front-side conductive paste can dissolve a sufficient amount of silver during the sintering process. One portion of the liquid oxide etching agent in which the silver is dissolved is used to wet the metal powder and facilitate the sintering of the metal powder. The other portion flows to the surface of the solar cell chip and reacts with the anti-reflective layer, so that the anti-reflective layer is effectively etched. During the cooling process after sintering, the liquid oxide etching agent is deposited on the silicon substrate as a high resistivity solid layer, the silver dissolved in the liquid oxide etching agent is precipitated out to form fine silver nanoparticles which is distributed in the high resistivity solid layer of the oxide etching agent, which allows the metal powder to form a good ohmic contact with the silicon, thus reducing the contact resistance. In this way, a front-side electrode with low contact resistance, good electrical conductivity and strong adhesion is formed.

Since the crystalline silicon solar cell chip provided in the invention includes employing the above-mentioned front-side electrode structure of a crystalline silicon solar cell chip, the solar cell chip structure exhibits good adhesion; and the silver electrode has an excellent ohmic contact with the silicon chip of the solar cell chip, so that the conversion efficiency and the reliability of the solar cell chip is improved.

Figure 1:
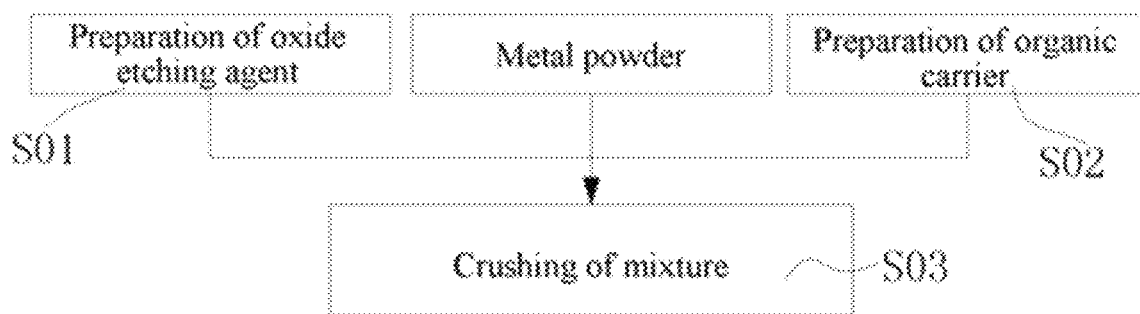
FIG. 1 is a schematic flowchart of a method for preparing a front-side conductive paste for a crystalline silicon solar cell chip provided in the present disclosure.

In the figures, 100—crystalline silicon substrate; 101—a first surface of the substrate; 102—a second surface of the substrate; 200—P/N junction layer; 300—insulating film; 400—printed front-side conductive paste, 401—metal powder, 402—organic carrier, 403—oxide etching agent; 500—printed back-side silver paste; 600—printed back-side aluminum paste; 700—front-side electrode; 800—solder strip; 900—tensile tester; 901—first fixing bolt for tensile sample; 902—second fixing bolt for tensile sample; F—direction of tensile force.

DETAILED DESCRIPTION OF THE INVENTION

To make the technical problem to be solved, the technical solution, and the beneficial effects of the present invention clearer, the present invention is further described in detail with reference to examples and accompanying drawings. It should be understood that the specific examples described herein are merely provided for illustrating, instead of limiting the present invention.

In an aspect, the present disclosure provides a front-side conductive paste for a crystalline silicon solar cell chip includes, based on 100 parts by weight, metal powder of 80.0-93.0 parts, organic carrier of 6.0-15.0 parts, and oxide etching agent of 1.0-5.0 parts. Based on 100% by mole, the oxide etching agent contains 10.0-40.0% of MgO, 0.1-5.0% of $B_2O_3$, 0.1-5% of PbO, 5.0-30.0% of $Li_2O$, with the mole ratio of MgO:PbO being in a range of 10:5~40:0.1, and the mole ratio of MgO:$Li_2O$ being in a range of 10:30~40:5. More specifically, the oxide etching agent includes based on 100% by mole: PbO of 0.1~5%, $TeO_2$ of 30.0~60.0%, $Li_2O$ of 5.0-30.0%, $SiO_2$ of 5.0~25.0%, $B_2O_3$ of 0.1~5.0%, $Bi_2O_3$ of 1.0~15.0%, MgO of 10.0~40.0%, ZnO of 10.0~25.0%, and some additive elements of 0-5.0%.

Optionally, for forming the conductive paste the metal powder of 80.0-83.0 parts is used. Optionally, the metal powder of 83.0-86.0 parts is used. Optionally, the metal powder of 86.0-89.0 parts is used. Optionally, the metal powder of 89.0-91.5 parts is used. Optionally, the metal powder of 91.5-93.0 parts is used. Optionally, for forming the conductive paste the organic carrier of 6.0-7.0 parts is used. Optionally, the organic carrier of 7.0-8.5 parts is used. Optionally, the organic carrier of 8.5-10.0 parts is used. Optionally, the organic carrier of 10.0-11.0 parts is used. Optionally, the organic carrier of 11.0-12.0 parts is used. Optionally, the organic carrier of 12.0-13.0 parts is used. Optionally, the organic carrier of 13.0-15.0 parts is used. Optionally, the oxide etching agent of 1.0-2.0 parts is used. Optionally, the oxide etching agent of 2.0-3.0 parts is used. Optionally, the oxide etching agent of 3.0-4.0 parts is used. Optionally, the oxide etching agent of 4.0-5.0 parts is used. Optionally, the mole ratio of MgO:PbO in the oxide etching agent is 14:5. Optionally, the mole ratio of MgO:PbO in the oxide etching agent is 20:3. Optionally, the mole ratio of MgO:PbO in the oxide etching agent is 55:5. Optionally, the mole ratio of MgO:PbO in the oxide etching agent is 90:7. Optionally, the mole ratio of MgO:PbO in the oxide etching agent is 235:6. Optionally, the mole ratio of MgO:PbO in the oxide etching agent is 365:1. Optionally, the mole ratio of MgO:Li$_2$O is 2: 3. Optionally, the mole ratio of MgO:Li$_2$O is 4:2.5. Optionally, the mole ratio of MgO:Li$_2$O is 1:1. Optionally, the mole ratio of MgO:Li$_2$O is 6:4. Optionally, the mole ratio of MgO:Li$_2$O is 7:5. Optionally, the mole ratio of MgO:Li$_2$O is 2:1. More specifically, based on 100% by mole, the oxide etching agent includes 10.5~12.5% of MgO. Optionally, the oxide etching agent includes 12.5~15% of MgO. Optionally, the oxide etching agent includes 15~24% of MgO. Optionally, the oxide etching agent includes 24~30% of MgO. Optionally, the oxide etching agent includes 30~35% of MgO. Optionally, the oxide etching agent includes 35~40% of MgO. Optionally, based on 100% by mole, the oxide etching agent includes 0.1~0.5% of PbO. Optionally, the oxide etching agent includes 0.5~1% of PbO. Optionally, the oxide etching agent includes 1~2% of PbO. Optionally, the oxide etching agent includes 2~3.5% of PbO. Optionally, the oxide etching agent includes 3.5~4.5% of PbO. Optionally, the oxide etching agent includes 4.5~5% of PbO. Optionally, based on 100% by mole the oxide etching agent includes 30.0~35.0% of TeO$_2$. Optionally, the oxide etching agent includes 35.0~45.0% of TeO$_2$. Optionally, the oxide etching agent includes 45.0~50.0% of TeO$_2$. Optionally, the oxide etching agent includes 50.0~55.0% of TeO$_2$. Optionally, the oxide etching agent includes 55.0~60.0% of TeO$_2$. Optionally, based on 100% by mole the oxide etching agent includes 5.0~9.0% of Li$_2$O. Optionally, the oxide etching agent includes 9.0~14.0% of Li$_2$O. Optionally, the oxide etching agent includes 14.0~19.0% of Li$_2$O. Optionally, the oxide etching agent includes 19.0~22.0% of Li$_2$O. Optionally, the oxide etching agent includes 22.0~26.0% of Li$_2$O. Optionally, the oxide etching agent includes 26.0~28.0% of Li$_2$O. Optionally, the oxide etching agent includes 28.0~30.0% of Li$_2$O. Optionally, based on 100% by mole the oxide etching agent includes 5.0~8.0% of SiO$_2$. Optionally, the oxide etching agent includes 8.0~11.0% of SiO$_2$. Optionally, the oxide etching agent includes 11.0~15.0% of SiO$_2$. Optionally, the oxide etching agent includes 15.0~19.0% of SiO$_2$. Optionally, the oxide etching agent includes 19.0~23.0% of SiO$_2$. Optionally, the oxide etching agent includes 23.0~25.0% of SiO$_2$. Optionally, based on 100% by mole the oxide etching agent includes 0.1~0.5% of B$_2$O$_3$. Optionally, the oxide etching agent includes 0.5%~1.0% of B$_2$O$_3$. Optionally, the oxide etching agent includes 1.0%~2.5% of B$_2$O$_3$. Optionally, the oxide etching agent includes 2.5%~3.0% of B$_2$O$_3$. Optionally, the oxide etching agent includes 3.0%~4.0% of B$_2$O$_3$. Optionally, the oxide etching agent includes 4.0%~5.0% of B$_2$O$_3$. Optionally, based on 100% by mole the oxide etching agent includes 1.0~3.0% of Bi$_2$O$_3$. Optionally, the oxide etching agent includes 3.0~5.0% of Bi$_2$O$_3$. Optionally, the oxide etching agent includes 5.0~8.0% of Bi$_2$O$_3$. Optionally, the oxide etching agent includes 8.0~11.0% of Bi$_2$O$_3$. Optionally, the oxide etching agent includes 11.0~14.0% of Bi$_2$O$_3$. Optionally, the oxide etching agent includes 14.0~15.0% of Bi$_2$O$_3$. Optionally, based on 100% by mole the oxide etching agent includes 10.0~13.0% of ZnO. Optionally, the oxide etching agent includes 13.0~15.5% of ZnO. Optionally, the oxide etching agent includes 15.5~18.5% of ZnO. Optionally, the oxide etching agent includes 18.5~20.0% of ZnO. Optionally, the oxide etching agent includes 20.0~22.0% of ZnO. Optionally, the oxide etching agent includes 22.0~24.0% of ZnO. Optionally, the oxide etching agent includes 24.0~25.0% of ZnO.

This invention provides a special formulation of the oxide etching agent which contains MgO, PbO, ZnO, and Li$_2$O components, and these components exist in a specific proportion, these specific proportion of components can exhibit excellent etching and wetting properties. During the application of printing the conductive paste having the etching agent on silicon solar cell chip surface followed by sintering, the oxide etching agent is melted to form a liquid during the sintering process to have silver dissolved therein. One portion of the liquid oxide etching agent in which the silver is dissolved is to wet the metal powder and facilitate the sintering of the metal powder. The other portion of the liquid oxide etching agent in which the silver is dissolved flows to the surface of the solar cell chip and reacts with the anti-reflective layer, so that the anti-reflective layer is effectively etched. During the cooling process after sintering, the liquid oxide etching agent is deposited on the silicon substrate as a high resistivity solid layer, the silver dissolved in the liquid oxide etching agent is precipitated out to form fine silver nanoparticles which is distributed in the high resistivity solid layer of the oxide etching agent, which allows the metal powder to form a good ohmic contact with the silicon, thus reducing the resistance. More dissolved silver in the liquid oxide etching agent during the sintering leads to more precipitation out of the fine silver nanoparticles during the cooling process and better ohmic contact between metal powders and silicon substrate. In this way, a front-side electrode with low contact resistance, good electrical conductivity and strong adhesion is formed.

In the technical solutions described above, the additional element in the oxide of the additional element is one or two or more of titanium, aluminum, silver, chromium, scandium, copper, niobium, vanadium, sodium, tantalum, strontium, bromine, cobalt, hafnium, lanthanum, yttrium, ytterbium, iron, barium, manganese, tungsten, nickel, tin, arsenic, zirconium, potassium, phosphorus, indium, gallium, and germanium.

The oxide etching agent in the solution of the present invention includes not only an oxide prepared by a chemical method and an oxide obtained by a high-temperature treatment, but also a carbonate, a phosphate, and a fluoride containing a cation, etc. For example, the lithium oxide Li$_2$O may be replaced by Li$_2$CO, the PbO may be replaced by Pb$_3$O$_4$.

Preferably, in the present solution, the oxide etching agent may be crystalline, amorphous, or a mixture of amorphous and crystalline.

Optionally, the metal powder is particles of at least one metal element of silver, gold, platinum, copper, iron, nickel, zinc, titanium, cobalt, chromium, aluminum, manganese, palladium, and rhodium.

Optionally, the metal powder is silver-coated particles. Each particle is at least one metal element of copper, iron, nickel, zinc, titanium, cobalt, chromium, aluminum, and manganese, coated by a silver layer of a thickness in a range of 10-50 nm.

Optionally, the metal powder is a mixture of a non-silver-coated metal powder and a silver-coated metal powder, where a weight ratio of the non-silver coated metal powder to the silver-coated metal powder is in a range from 5/95 to 95/5. The non-silver-coated metal powder includes at least one metal element of silver, gold, platinum, copper, iron, nickel, zinc, titanium, cobalt, chromium, aluminum, manganese, palladium, and rhodium, the silver-coated metal powder includes at least one metal element of copper, iron, nickel, zinc, titanium, cobalt, chromium, aluminum, and manganese. Particles of the silver-coated metal powder includes a silver coating with a thickness in a range of 10-200 nm.

The organic carrier mentioned in the present invention includes an organic solvent, a polymer, a wetting dispersant, a thixotropic agent, and an additional functional additive.

Based on 100 parts by weight of the organic carrier, the organic carrier includes 50-95 parts of the organic solvent; 1-40 parts of the polymer; 0.1-10 parts of the wetting dispersant; and 1-20 parts of the thixotropic agent. Optionally, based on 100 parts by weight, the organic carrier includes 50-55 parts of the organic solvent. Optionally, the organic carrier includes 55-65 parts of the organic solvent. Optionally, the organic carrier includes 65-75 parts of the organic solvent. Optionally, the organic carrier includes 75-85 parts of the organic solvent. Optionally, the organic carrier includes 85-90 parts of the organic solvent. Optionally, the organic carrier includes 90-95 parts of the organic solvent. Optionally, the organic carrier includes 1-5 parts of the polymer. Optionally, the organic carrier includes 5-10 parts of the polymer. Optionally, the organic carrier includes 10-20 parts of the polymer. Optionally, the organic carrier includes 20-30 parts of the polymer. Optionally, the organic carrier includes 30-35 parts of the polymer. Optionally, the organic carrier includes 35-40 parts of the polymer. Optionally, the organic carrier includes 0.1-0.4 parts of the wetting dispersant. Optionally, the organic carrier includes 0.4-0.9 parts of the wetting dispersant. Optionally, the organic carrier includes 0.9-1.5 parts of the wetting dispersant. Optionally, the organic carrier includes 1.5-3.0 parts of the wetting dispersant. Optionally, the organic carrier includes 3.0-5.0 parts of the wetting dispersant. Optionally, the organic carrier includes 5.0-7.0 parts of the wetting dispersant. Optionally, the organic carrier includes 7.0-9.0 parts of the wetting dispersant. Optionally, the organic carrier includes 9.0-9.5 parts of the wetting dispersant. Optionally, the organic carrier includes 9.5-10.0 parts of the wetting dispersant. Optionally, the organic carrier includes 1-4 parts of the thixotropic agent. Optionally, the organic carrier includes 4-10 parts of the thixotropic agent. Optionally, the organic carrier includes 10-14 parts of the thixotropic agent. Optionally, the organic carrier includes 14-18 parts of the thixotropic agent. Optionally, the organic carrier includes 18-20 parts of the thixotropic agent.

The organic solvent is at least one selected from terpineol, ethylene glycol butyl ether acetate, ethylene glycol ethyl ether acetate, a dodecanol ester, diethylene glycol butyl ether, triethylene glycol butyl ether, tripropylene glycol methyl ether, a terpene, and other high-boiling point solvents.

The polymer is at least one selected from ethyl cellulose, methyl cellulose, cellulose and a derivative thereof, an acrylic resin, an alkyd resin, and a polyester resin.

The wetting dispersant is one or two or more selected from a fatty acid (e.g. oleic acid and stearic acid), an amide derivative of a fatty acid (e.g. oleamide, and stearamide), an ester derivative of a fatty acid, polyethylene wax, and polyethylene glycol, which mainly functions to disperse the inorganic powder in the organic carrier.

The thixotropic agent is one or two or more selected from a hydrogenated castor oil derivative, polyamide wax, polyurea, and fumed silica, and mainly functions to increase the thixotropy of the paste during the printing process, so that the consistency of the silver paste becomes smaller when sheared during the printing process, and it is easy to perform screen printing; and when the shearing is stopped, the consistency is increased to ensure that the electrode has an excellent aspect ratio.

Further, the organic carrier may also include a functional additive in an amount of 0.1-20 parts by weight from one or two or more chemical species selected from poly (methylphenyl) siloxane, polyphenylsiloxane, a phthalate (e.g. diethyl phthalate, and dibutyl phthalate), micro-crystalline wax, polydimethylsiloxane, polyvinylbutyral (PVB), a polyether- and polyester-modified organosiloxane, and an alkyl-modified organosiloxane. The additional functional additive may be optionally added, for example, microcrystalline wax is added to reduce the surface tension, dibutyl phthalate (DBP) is added to improve the flexibility of the paste, and polyvinylbutyral (PVB) is added to improve the adhesion. Optionally, the functional additive mentioned above is included in the organic carrier by an amount of 0.1-0.4 parts. Optionally, the functional additive mentioned above is included in the organic carrier by an amount of 0.4-0.9 parts. Optionally, the functional additive mentioned above is included in the organic carrier by an amount of 0.9-1.4 parts. Optionally, the functional additive mentioned above is included in the organic carrier by an amount of 1.4-2.0 parts. Optionally, the functional additive mentioned above is included in the organic carrier by an amount of 2.0-3.5 parts. Optionally, the functional additive mentioned above is included in the organic carrier by an amount of 3.5-5.0 parts. Optionally, the functional additive mentioned above is included in the organic carrier by an amount of 5.0-10.0 parts. Optionally, the functional additive mentioned above is included in the organic carrier by an amount of 10.0-15.0 parts. Optionally, the functional additive mentioned above is included in the organic carrier by an amount of 15.0-18.0 parts. Optionally, the functional additive mentioned above is included in the organic carrier by an amount of 18.0-19.0 parts. Optionally, the functional additive mentioned above is included in the organic carrier by an amount of 19.0-20.0 parts.

As shown in FIG. 1, a method for preparing a front-side conductive paste for a crystalline silicon solar cell chip according to the present invention includes the following steps:

S01. Preparation of oxide etching agent: Raw materials of the oxide etching agent are weighed according to the raw material proportion in any one of the above three solutions and uniformly mixed; the uniformly mixed raw materials of the oxide etching agent are placed in a oven and heated to 900-1100° C. for 60-180 min, to obtain a melted liquid oxide etching agent; the melted liquid oxide etching agent is quenched, to obtain a particulate oxide etching agent; the particulate oxide etching agent is dried at a temperature of 60-80° C.; and the dried particulate oxide etching agent is crushed to obtain a powdered oxide etching agent having a particle size of 0.5-5.0 μm, which is then dried in a drying oven at 80-100° C. to obtain a dried powdered oxide etching agent.

Optionally, the quenching method includes cooling the melted liquid oxide etching agent by pouring it into water at a temperature of 5-25° C. or cooling in flowing cold air at room temperature, where the temperature of the flowing cold air is at 25° C. or below.

The above-mentioned crushing of the particulate oxide etching agent may be performed by ball milling in a ball miller, or by other methods such as jet milling to make the particle size of the oxide etching agent smaller.

S02. Preparation of organic carrier: Raw materials of the organic carrier are sequentially weighed according to the weight proportion of the raw materials of the organic carrier as described above, and the weighed raw materials of the organic carrier are placed in a container, and mixed by stirring at a temperature of 40-100° C. for 100-160 min to obtain an organic carrier.

S03. Preparation of front-side conductive paste: The metal powder is mixed with the above prepared oxide etching agent and organic carrier, and ground to obtain front-side conductive silver paste.

An alternative method for preparing a front-side conductive paste for a crystalline silicon solar cell chip according to the present invention is also provided.

In an embodiment, the oxide etching agent and the metal powder are first mixed to obtain a first mixture, and then the first mixture is mixed with the organic carrier, and ground to obtain the front-side conductive paste for a crystalline silicon solar cell chip.

In another embodiment, the oxide etching agent and the organic carrier are first mixed to obtain a first mixture, and then the metal powder is added to the first mixture, and ground to obtain the front-side conductive paste for a crystalline silicon solar cell chip.

In still another embodiment, the metal powder and organic carrier are first mixed to obtain a first mixture, and then the oxide etching agent is added to the first mixture, and ground to obtain the front-side conductive paste for a crystalline silicon solar cell chip.

In a further embodiment, the amounts of the metal powder, organic carrier, and oxide etching agent are respectively taken as 100 parts by weight; and 20-60 parts by weight of the metal powder and 20-60 parts by weight of the organic carrier are first mixed to obtain a first mixture, then 40-80 parts by weight of the oxide etching agent is mixed with a part of the organic carrier to obtain a second mixture, and then the first mixture is mixed with the second mixture, and ground to obtain the front-side conductive paste for a crystalline silicon solar cell chip.

Figure 2:
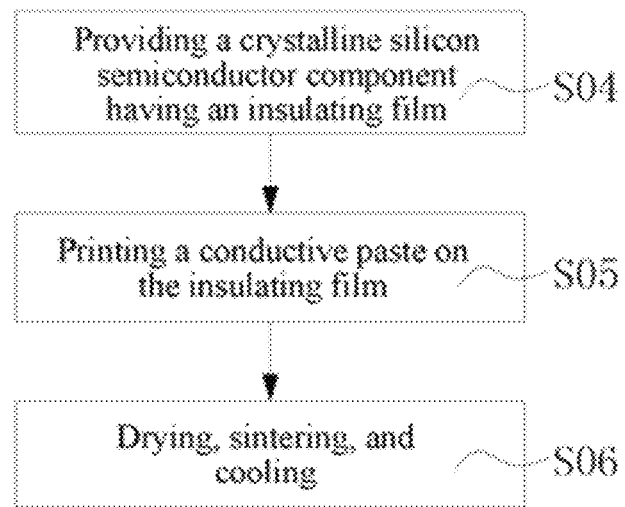
FIG. 2 is a schematic flowchart of a method for fabricating a front-side electrode of a crystalline silicon solar cell chip provided in the present disclosure.
Figure 3:
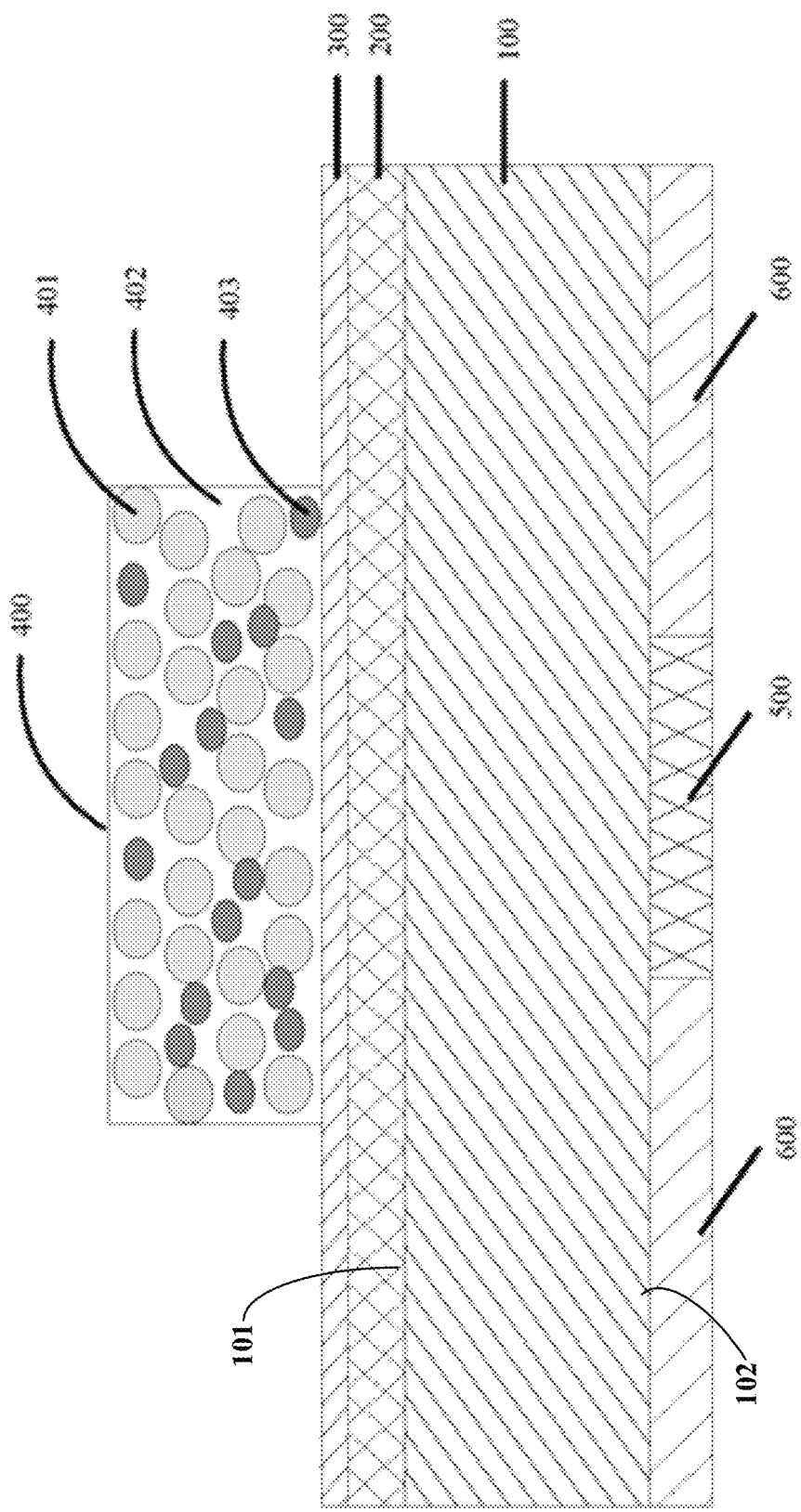
FIG. 3 is a schematic diagram showing a crystalline silicon substrate having a surface provided with an insulating film, on which a front-side conductive paste according to the present disclosure is printed.
Figure 4:
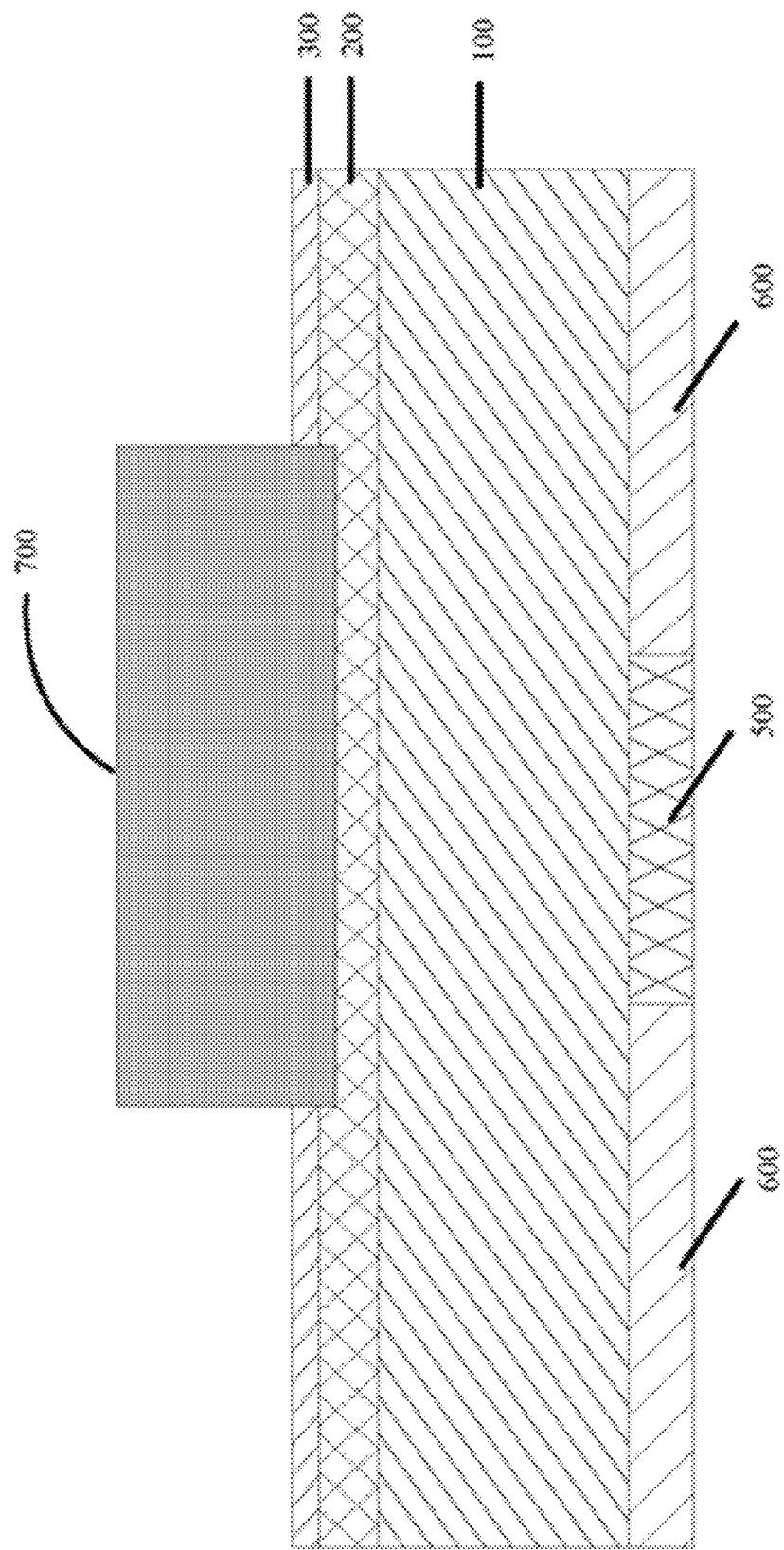
FIG. 4 is a schematic diagram showing the sintered crystalline silicon substrate printed with a front-side and a back-side paste shown in FIG. 3 in the present disclosure.

Referring to FIG. 2, FIG. 3 and FIG. 4, the present invention further provides a method for fabricating a front-side electrode of a crystalline silicon solar cell chip.

In the fabrication method, a crystalline silicon substrate has a surface having an insulating film deposited, as shown in FIG. 3. Referring to FIG. 3, a crystalline silicon chip 100 having a first surface 101 and a second surface 102 opposing to each other. On the first surface 101, a P/N junction layer 200 and an insulating film 300 are sequentially formed. On the second surface 102, a back-side silver paste 500 and a back-side aluminum paste 600 are printed. Optionally, the insulating film 300 may be deposited with at least one of a silicon nitride film, a titanium oxide film, an aluminum oxide film, and a silicon oxide film.

Specifically, the method for fabricating a front-side electrode of a crystalline silicon solar cell chip includes at least the following steps:

Step S04: A crystalline silicon substrate having an insulating film 300 deposited on its surface is provided.

Step S05: A front-side conductive paste 400 for a crystalline silicon solar cell chip (where 401 is a metal powder, 402 is an organic carrier, and 403 is an oxide etching agent) according to any one of the above solutions is printed on a surface of the insulating film 300.

Step S06: The crystalline silicon substrate treated in the step S05 is sequentially dried, sintered, and cooled to obtain a front-side electrode 700 of a crystalline silicon solar cell chip as shown in FIG. 4.

Specifically, the drying temperature is 80-400° C., the sintering temperature is 700-820° C., and the cooling is natural cooling (in flowing air at room temperature).

The present invention further provides a crystalline silicon solar cell chip employing a front-side electrode as described above.

In order to better illustrate the front-side conductive paste for a crystalline silicon solar cell chip and the preparation method therefor provided in the embodiments of the present invention, the present invention is further described by way of examples hereinafter.

Example 1

A front-side conductive paste for a crystalline silicon solar cell chip includes, based on 100 parts by weights, 88.0 parts of a silver powder; 9.0 parts of an organic carrier; and 3.0 parts of an oxide etching agent.

Based on 100% by mole of the oxide etching agent, the oxide etching agent includes: PbO 1.0%, $TeO_2$ 33.0%, $Li_2O$ 30.0%, $SiO_2$ 10.9%, $B_2O_3$ 0.1%, $Bi_2O_3$ 5.0%, MgO 10.0%, ZnO 10.0%.

The oxide etching agent is prepared as follows: Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at room temperature (~25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell chip includes the following steps. 88.0 parts of the silver powder, 9.0 parts of the organic carrier and 3.0 parts of the oxide etching agent powder are weighed according to the above weight proportions, uniformly mixed and ground to obtain a front-side conductive paste for a crystalline silicon solar cell chip.

A method for fabricating a front-side electrode of a crystalline silicon solar cell chip includes the following steps. The front-side conductive paste for a crystalline silicon solar cell chip obtained in Example 1 is printed by screen printing on a front side of a crystalline silicon solar cell chip having an insulating film, where a back side of the solar cell chip is screen printed with a back-side silver paste and a back-side aluminum paste. Then, the solar cell chip is sintered at about 820° C. to form a front-side electrode of the crystalline silicon solar cell chip. During the sintering, the organic carrier in the front-side conductive paste is evaporated, the oxide etching agent in the front-side conductive paste is melted to form a liquid to contact with the silver powders to allow silver to be dissolved therein. One portion of the liquid oxide etching agent in which the silver is dissolved is used to wet the metal powder and facilitate the sintering of the metal powders. The other portion of the liquid oxide etching agent in which the silver is dissolved flows to the surface of the solar cell chip and reacts with the anti-reflective layer, so that the anti-reflective layer is effectively etched. During the cooling process after sintering, the liquid oxide etching agent is deposited on the silicon substrate as a high-resistivity solid layer (an insulation film), the silver dissolved in the liquid oxide etching agent is precipitated out to form fine silver nanoparticles which is distributed in the high-resistivity solid layer of the oxide etching agent, which allows the metal powder to form a good ohmic contact with the silicon, thus reducing the resistance. In this way, a front-side electrode with low contact resistance, good electrical conductivity and strong adhesion is formed.

The efficiency of the obtained silicon solar cell chip is tested, and the I-V test results are summarized in Table 1.

Example 2

A front-side conductive paste for a crystalline silicon solar cell chip includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes: PbO 2.0%, $TeO_2$ 30.0%, $Li_2O$ 10.0%, $SiO_2$ 5.0%, $B_2O_3$ 1.0%, $Bi_2O_3$ 2.0%, MgO 40.0%, ZnO 10.0%.

The oxide etching agent is prepared as follows: Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at room temperature (~25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 µm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell chip includes the following steps. 88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell chip.

A method for fabricating a front-side electrode of a crystalline silicon solar cell chip includes the following steps. The front-side conductive paste obtained in Example 2 is printed by screen printing on a front side of a crystalline silicon solar cell chip having an insulating film, where a back side of the solar cell chip is screen printed with a back-side silver paste and a back-side aluminum paste. Then, the solar cell chip is sintered at 790° C. to obtain a front-side electrode of the crystalline silicon solar cell chip.

The efficiency of the obtained silicon solar cell chip is tested, and the I-V test results are summarized in Table 1.

Example 3

A front-side conductive paste for a crystalline silicon solar cell chip includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes: PbO 4.0%, $TeO_2$ 44.0%, $Li_2O$ 10.0%, $SiO_2$ 6.0%, $B_2O_3$ 3.0%, $Bi_2O_3$ 6.0%, MgO 12.0%, ZnO 15.0%.

The oxide etching agent is prepared as follows: Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at room temperature (~25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 µm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell chip includes the following steps. 88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell chip.

A method for fabricating a front-side electrode of a crystalline silicon solar cell chip includes the following steps. The front-side conductive paste obtained in Example 3 is printed by screen printing on a front side of a crystalline silicon solar cell chip having an insulating film, where a back side of the solar cell chip is screen printed with a back-side silver paste and a back-side aluminum paste. Then, the solar cell chip is sintered at 780° C. to obtain a front-side electrode of the crystalline silicon solar cell chip.

The efficiency of the obtained silicon solar cell chip is tested, and the I-V test results are summarized in Table 1.

Example 4

A front-side conductive paste for a crystalline silicon solar cell chip includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes PbO 2.0%, $TeO_2$ 30.0%, $Li_2O$ 16.0%, $SiO_2$ 6.0%, $B_2O_3$ 2.0%, $Bi_2O_3$ 4.0%, MgO 15.0%, ZnO 25.0%.

The oxide etching agent is prepared as follows: Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at room temperature (~25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 µm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell chip includes the following steps. 88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell chip.

A method for fabricating a front-side electrode of a crystalline silicon solar cell chip includes the following steps. The front-side conductive paste obtained in Example 4 is printed by screen printing on a front side of a crystalline silicon solar cell chip having an insulating film, where a back side of the solar cell chip is screen printed with a back-side silver paste and a back-side aluminum paste. Then, the solar cell chip is sintered at 780° C. to obtain a front-side electrode of the crystalline silicon solar cell chip.

The efficiency of the obtained silicon solar cell chip is tested, and the I-V test results are summarized in Table 1.

Example 5

A front-side conductive paste for a crystalline silicon solar cell chip includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes PbO 1.5%, $TeO_2$ 30.0%, $Li_2O$ 10.0%, $SiO_2$ 24.0%, $B_2O_3$ 4.5%, $Bi_2O_3$ 4.0%, MgO 16.0%, ZnO 10.0%.

The oxide etching agent is prepared as follows: Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at room temperature (~25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell chip includes the following steps. 88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell chip.

A method for fabricating a front-side electrode of a crystalline silicon solar cell chip includes the following steps. The front-side conductive paste for a crystalline silicon solar cell chip obtained in Example 5 is printed by screen printing on a front side of a crystalline silicon solar cell chip having an insulating film, where a back side of the solar cell chip is screen printed with a back-side silver paste and a back-side aluminum paste. Then, the solar cell chip is sintered at 790° C. to obtain a front-side electrode of the crystalline silicon solar cell chip.

The efficiency of the obtained silicon solar cell chip is tested, and the I-V test results are summarized in Table 1.

Example 6

A front-side conductive paste for a crystalline silicon solar cell chip includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes PbO 1.2%, $TeO_2$ 35.0%, $Li_2O$ 20.0%, $SiO_2$ 7.0%, $B_2O_3$ 5.0%, $Bi_2O_3$ 4.0%, MgO 20.0%, ZnO 7.8%.

The oxide etching agent is prepared as follows: Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at room temperature (~25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell chip includes the following steps. 88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell chip.

A method for fabricating a front-side electrode of a crystalline silicon solar cell chip includes the following steps. The front-side conductive paste obtained in Example 6 is printed by screen printing on a front side of a crystalline silicon solar cell chip having an insulating film, where a back side of the solar cell chip is screen printed with a back-side silver paste and a back-side aluminum paste. Then, the solar cell chip is sintered at 800° C. to obtain a front-side electrode of the crystalline silicon solar cell chip.

The efficiency of the obtained silicon solar cell chip is tested, and the I-V test results are summarized in Table 1.

Example 7

A front-side conductive paste for a crystalline silicon solar cell chip includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes PbO 3.0%, $TeO_2$ 35%, $Li_2O$ 15%, $SiO_2$ 7%, $B_2O_3$ 2.0%, $Bi_2O_3$ 2%, MgO 19%, ZnO 17%.

The oxide etching agent is prepared as follows. Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at room temperature (~25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell chip includes the following steps. 88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell chip.

A method for fabricating a front-side electrode of a crystalline silicon solar cell chip includes the following steps. The front-side conductive paste obtained in Example 7 is printed by screen printing on a front side of a crystalline silicon solar cell chip having an insulating film, where a back side of the solar cell chip is screen printed with a back-side silver paste and a back-side aluminum paste. Then, the solar cell chip is sintered at 800° C. to obtain a front-side electrode of the crystalline silicon solar cell chip.

The efficiency of the obtained silicon solar cell chip is tested, and the I-V test results are summarized in Table 1.

Example 8

A front-side conductive paste for a crystalline silicon solar cell chip includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes PbO 0.1%, $TeO_2$ 31%, $Li_2O$ 10%, $SiO_2$ 5%, $B_2O_3$ 3.5%, $Bi_2O_3$ 10%, MgO 30%, ZnO 10%.

The oxide etching agent is prepared as follows: Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at room temperature (~25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell chip includes the following steps. 88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell chip.

A method for fabricating a front-side electrode of a crystalline silicon solar cell chip includes the following steps. The front-side conductive paste obtained in Example 8 is printed by screen printing on a front side of a crystalline silicon solar cell chip having an insulating film, where a back side of the solar cell chip is screen printed with a back-side silver paste and a back-side aluminum paste. Then, the solar cell chip is sintered at 800° C. to obtain a front-side electrode of the crystalline silicon solar cell chip.

The efficiency of the obtained silicon solar cell chip is tested, and the I-V test results are summarized in Table 1.

Example 9

A front-side conductive paste for a crystalline silicon solar cell chip includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes PbO 2.0%, $TeO_2$ 36%, $Li_2O$ 16%, $SiO_2$ 9%, $B_2O_3$ 10.0%, $Bi_2O_3$ 4%, MgO 5.0%, ZnO 18%.

The oxide etching agent is prepared as follows: Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at room temperature (~25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell chip includes the following steps. 88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell chip.

A method for fabricating a front-side electrode of a crystalline silicon solar cell chip includes the following steps. The front-side conductive paste obtained in Example 9 is printed by screen printing on a front side of a crystalline silicon solar cell chip having an insulating film, where a back side of the solar cell chip is screen printed with a back-side silver paste and a back-side aluminum paste. Then, the solar cell chip is sintered at 800° C. to obtain a front-side electrode of the crystalline silicon solar cell chip.

The efficiency of the obtained silicon solar cell chip is tested, and the I-V test results are summarized in Table 1.

Example 10

A front-side conductive paste for a crystalline silicon solar cell chip includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes PbO 2.0%, $TeO_2$ 25%, $Li_2O$ 33%, $SiO_2$ 6%, $B_2O_3$ 8.0%, $Bi_2O_3$ 3%, MgO 3.0%, ZnO 20%.

The oxide etching agent is prepared as follows. Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at room temperature (~25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell chip includes the following steps. 88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell chip.

A method for fabricating a front-side electrode of a crystalline silicon solar cell chip includes the following steps. The front-side conductive paste obtained in Example 10 is printed by screen printing on a front side of a crystalline silicon solar cell chip having an insulating film, where a back side of the solar cell chip is screen printed with a back-side silver paste and a back-side aluminum paste. Then, the solar cell chip is sintered at 800° C. to obtain a front-side electrode of the crystalline silicon solar cell chip.

The efficiency of the obtained silicon solar cell chip is tested, and the I-V test results are summarized in Table 1.

Example 11

A front-side conductive paste for a crystalline silicon solar cell chip includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes PbO 2.0%, $TeO_2$ 44%, $Li_2O$ 5.0%, $SiO_2$ 3.0%, $B_2O_3$ 6.0%, $Bi_2O_3$ 3.0%, MgO 7.0%, ZnO 30%.

The oxide etching agent is prepared as follows. Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at room temperature (~25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell chip includes the following steps. 88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell chip.

A method for fabricating a front-side electrode of a crystalline silicon solar cell chip includes the following steps. The front-side conductive paste obtained in Example 11 is printed by screen printing on a front side of a crystalline silicon solar cell chip having an insulating film, where a back side of the solar cell chip is screen printed with a back-side silver paste and a back-side aluminum paste. Then, the solar cell chip is sintered at 800° C. to obtain a front-side electrode of the crystalline silicon solar cell chip.

The efficiency of the obtained silicon solar cell chip is tested, and the I-V test results are summarized in Table 1.

Example 12

A front-side conductive paste for a crystalline silicon solar cell chip includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes PbO 2.0%, $TeO_2$ 49%, $Li_2O$ 6.0%, $SiO_2$ 3.0%, $B_2O_3$ 7.0%, $Bi_2O_3$ 3.0%, MgO 2.0%, ZnO 28%.

The oxide etching agent is prepared as follows. Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at room temperature (~25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell chip includes the following steps. 88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell chip.

A method for fabricating a front-side electrode of a crystalline silicon solar cell chip includes the following steps. The front-side conductive paste obtained in Example 12 is printed by screen printing on a front side of a crystalline silicon solar cell chip having an insulating film, where a back side of the solar cell chip is screen printed with a back-side silver paste and a back-side aluminum paste. Then, the solar cell chip is sintered at 770° C. to obtain a front-side electrode of the crystalline silicon solar cell chip.

The efficiency of the obtained silicon solar cell chip is tested, and the I-V test results are summarized in Table 1.

Example 13

A front-side conductive paste for a crystalline silicon solar cell chip includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes PbO 5.0%, $TeO_2$ 23%, $Li_2O$ 14%, $SiO_2$ 3.0%, $B_2O_3$ 8.0%, $Bi_2O_3$ 3.0%, MgO 32%, ZnO 12%.

The oxide etching agent is prepared as follows. Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at room temperature (~25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell chip includes the following steps. 88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell chip.

A method for fabricating a front-side electrode of a crystalline silicon solar cell chip includes the following steps. The front-side conductive paste obtained in Example 13 is printed by screen printing on a front side of a crystalline silicon solar cell chip having an insulating film, where a back side of the solar cell chip is screen printed with a back-side silver paste and a back-side aluminum paste. Then, the solar cell chip is sintered at 800° C. to obtain a front-side electrode of the crystalline silicon solar cell chip.

The efficiency of the obtained silicon solar cell chip is tested, and the I-V test results are summarized in Table 1.

Example 14

A front-side conductive paste for a crystalline silicon solar cell chip includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes PbO 3.0%, $TeO_2$ 30%, $Li_2O$ 10%, $SiO_2$ 3.0%, $B_2O_3$ 8.0%, $Bi_2O_3$ 3.0%, MgO 35%, ZnO 8.0%.

The oxide etching agent is prepared as follows. Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at room temperature (~25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell chip includes the following steps. 88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell chip.

A method for fabricating a front-side electrode of a crystalline silicon solar cell chip includes the following steps. The front-side conductive paste obtained in Example 14 is printed by screen printing on a front side of a crystalline silicon solar cell chip having an insulating film, where a back side of the solar cell chip is screen printed with a back-side silver paste and a back-side aluminum paste. Then, the solar cell chip is sintered at 800° C. to obtain a front-side electrode of the crystalline silicon solar cell chip. The efficiency of the obtained silicon solar cell chip is tested, and the I-V test results are summarized in Table 1.

Example 15

A front-side conductive paste for a crystalline silicon solar cell chip includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes PbO 3.0%, $TeO_2$ 15%, $Li_2O$ 22%, $SiO_2$ 3.0%, $B_2O_3$ 8.0%, $Bi_2O_3$ 3.0%, MgO 40%, ZnO 6.0%.

The oxide etching agent is prepared as follows. Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at room temperature (~25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell chip includes the following steps. 88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell chip.

A method for fabricating a front-side electrode of a crystalline silicon solar cell chip includes the following steps. The front-side conductive paste obtained in Example 15 is printed by screen printing on a front side of a crystalline silicon solar cell chip having an insulating film, where a back side of the solar cell chip is screen printed with a back-side silver paste and a back-side aluminum paste. Then, the solar cell chip is sintered at 800° C. to obtain a front-side electrode of the crystalline silicon solar cell chip.

The efficiency of the obtained silicon solar cell chip is tested, and the I-V test results are summarized in Table 1.

Comparative Example

The front-side conductive paste PVMB for a crystalline silicon solar cell chip from the market is printed by screen printing on a front side of a crystalline silicon solar cell chip having the same insulating film as that in the examples, where a back side of the solar cell chip is screen printed with a back-side silver paste and a back-side aluminum paste. Then, the solar cell chip is sintered by heating to 800° C. to obtain a front-side electrode of the crystalline silicon solar cell chip. Then the efficiency of the silicon solar cell chip is tested, and the IV test results are summarized in Table 1.

Performance Tests (1) I-V Test

The silicon solar cell chips of Examples 1-15 and the solar cell chip of Comparative Example are subjected to an I-V test on a HALM IV tester, and the results are shown in Table 1.

(2) Tensile Test

Figure 5:
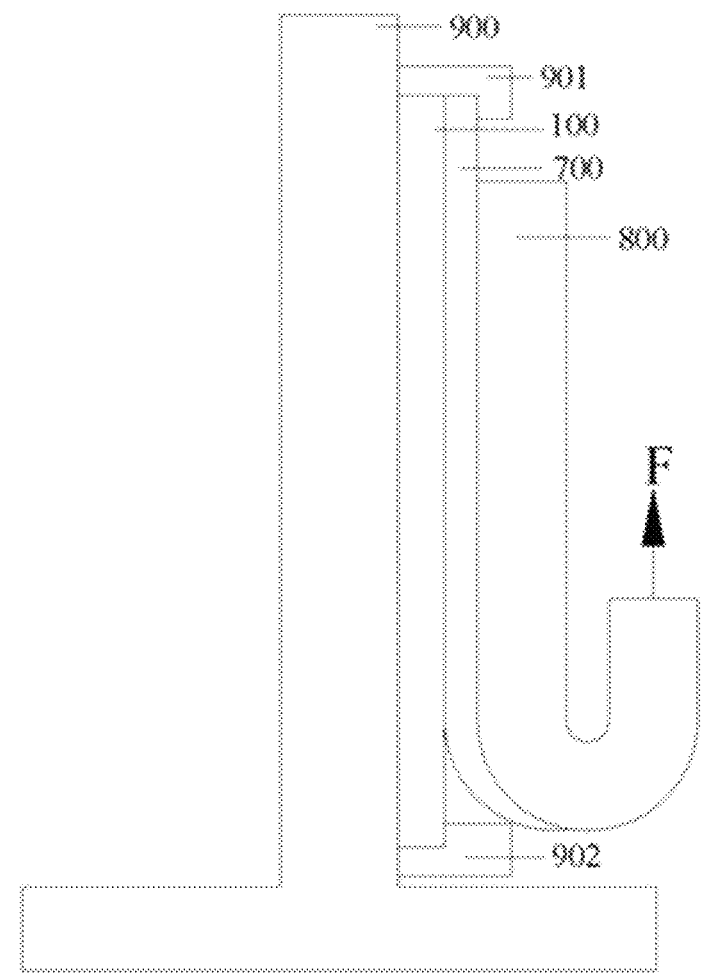
FIG. 5 is a schematic diagram showing a tensile test at 180 degrees.

A solder strip is soldered to a main grid and then a tensile test at 180 degrees is performed. The main grid is 1.0 mm wide, and a 1.2 mm-wide solder strip is soldered to the main grid. The solder strip is 1.2 mm wide, 0.25 mm thick and has a composition of 96.5% Sn and 3.5% Ag. FIG. 5 is a schematic diagram showing a tensile test at 180 degrees. Specifically, a solder strip 800 is first soldered to the surface of a main grid, and then the crystalline silicon cell chip 100 is fixed to a tensile tester 900 by using a first fixing bolt 901 and a second fixing bolt 902. The tensile test is performed in the direction of the tensile force F. The tensile test results are shown in Table 1.

surface. As a result, the solar cell chip has the characteristics of higher conversion efficiency, lower contact resistance $R_S$. Especially the solar cell chips using conductive paste prepared in one of examples 1-8 all show higher tensile strength than that of the comparative example using conventional front-electrode paste. The oxide etching agents in examples 1-8 are controlled to keep the molar ratio of MgO and PbO within the 10:5~40:0.1 range, and maintain the molar ratio of MgO and $Li_2O$ within the 10:30~40:5 range. The unique mole proportion of oxide components in the etching agent presented in the present disclosure allows it to effectively dissolve enough silver during the sintering process so that the insulating layer on the crystalline silicon surface can be fully etched without causing corrosion to the silicon cell below the insulating layer. The silver electrode and silicon surface thus can form an excellent ohmic contact and be in good adhesion at the same time. The good adhesion is characterized by the superior tensile strength data shown in Table 1. On the other hand, the conversion rate of solar cell chips in example 9-15 shown in Table 1 is lower than the comparative example as well as the examples of 1-8. The series resistance ($R_S$) is significantly higher than that of example 1-8, which suggests that proportions of oxide etching agent used in the examples 9-15 may be out of preferred ranges. Also, examples 9-12 have lower conversion rate of the cell is due to the fact that the MgO content in the oxide etching agent used is less than 10%, which is not in the optimum range. Examples 13-15 has lower conversion rate of the cell is due to the fact that the $B_2O_3$ content in the oxide etching agent used is higher than 5%, which is not in the optimum range.

The present invention has been described in detail with reference to preferred embodiments, which however are not

TABLE 1

Statistics of performance test data of crystalline silicon solar cell chips obtained in Examples 1-15 and in Comparative Example

| Scheme | Quantity | Uoc | Isc | FF | Eta | Rs | Rsh | IRev1 | F(N) |
|---|---|---|---|---|---|---|---|---|---|
| Exm. 1 | 16 pcs | 0.6291 | 1.8884 | 76.74 | 18.08 | 0.0181 | 350 | 0.11 | 5.04 |
| Exm. 2 | 16 pcs | 0.6286 | 1.8873 | 76.68 | 18.04 | 0.0186 | 411 | 0.09 | 4.98 |
| Exm. 3 | 16 pcs | 0.6295 | 1.8919 | 76.20 | 18.00 | 0.0190 | 226 | 0.22 | 4.82 |
| Exm. 4 | 16 pcs | 0.6309 | 1.8865 | 76.48 | 18.06 | 0.0182 | 238 | 0.19 | 4.95 |
| Exm. 5 | 16 pcs | 0.6297 | 1.8870 | 76.89 | 18.16 | 0.0179 | 247 | 0.14 | 4.96 |
| Exm. 6 | 16 pcs | 0.6287 | 1.8894 | 76.50 | 18.03 | 0.0181 | 218 | 0.14 | 4.97 |
| Exm. 7 | 16 pcs | 0.6293 | 1.8905 | 76.72 | 18.11 | 0.0180 | 211 | 0.23 | 5.05 |
| Exm. 8 | 16 pcs | 0.6294 | 1.8866 | 76.92 | 18.12 | 0.0175 | 318 | 0.13 | 4.82 |
| Exm. 9 | 16 pcs | 0.6090 | 1.8325 | 76.22 | 16.88 | 0.0204 | 294 | 0.19 | 4.99 |
| Exm. 10 | 16 pcs | 0.6099 | 1.8341 | 76.25 | 16.93 | 0.0206 | 568 | 0.11 | 4.69 |
| Exm. 11 | 16 pcs | 0.6101 | 1.8288 | 76.09 | 16.85 | 0.0206 | 456 | 0.16 | 4.47 |
| Exm. 12 | 16 pcs | 0.6107 | 1.8277 | 76.09 | 16.85 | 0.0208 | 251 | 0.22 | 5.02 |
| Exm. 13 | 16 pcs | 0.6258 | 1.8824 | 75.84 | 17.72 | 0.0203 | 328 | 0.16 | 4.61 |
| Exm. 14 | 16 pcs | 0.6245 | 1.8808 | 75.86 | 17.67 | 0.0199 | 505 | 0.11 | 4.53 |
| Exm. 15 | 16 pcs | 0.6255 | 1.8824 | 75.91 | 17.73 | 0.0199 | 535 | 0.11 | 5.37 |
| Com. Exm. | 16 pcs | 0.6288 | 1.8886 | 76.31 | 17.98 | 0.0183 | 453 | 0.07 | 3.78 |

From the table 1, compared with the proportional ratio, the example 1-8 of the solar cell chip of using the conductive paste according to the present disclosure has many advantages of high conversion rate, low series resistance ($R_S$), and especially high tensile force comparing to the comparative example. This shows that the oxide etching agent used in the embodiment 1-8 has superior etching performance and adhesion, which not only effectively wets and sinters the silver powder, but also effectively etches the insulating film on the surface of the solar cell chip. This makes the silver electrode to form an excellent ohmic contact with the solar cell chip intended to limit the present invention. Any modifications, equivalent substitutions and improvements can be made without departing from the spirit and principle of the present invention, which are all fall within the protection scope of the present invention.

What is claimed is:

1. A front-side conductive paste for a crystalline silicon solar cell chip, comprising, based on 100 parts by weight,
   82.0-93.0 parts of a metal powder;
   6.0-13.0 parts of an organic carrier;

1.0-5.0 parts of an oxide etching agent, wherein based on 100% by mole, the oxide etching agent comprises at least 10-40% of MgO, 0.1-5.0% of $B_2O_3$, 0.1-5% of PbO, and 5.0~30.0% of $Li_2O$;

wherein the oxide etching agent is configured, as the conductive paste is printed and sintered on a surface of an insulating film overlying a light-receiving front side of the crystalline silicon solar cell chip, to dissolve the metal powder and etch through the insulating film to form a front-side electrode in a good ohmic contact to silicon beneath the insulating film with a metal-silicon adhesion characterized by a lateral tensile force greater than 4 Newtons per 1 mm width.

2. The front-side conductive paste of claim 1, wherein the oxide etching agent further comprises, based on 100 parts by mole: $TeO_2$ of 30.0~60.0%; $SiO_2$ of 5.0~25.0%; $Bi_2O_3$ of 1.0~15.0%; and ZnO of 10.0~25.0%.

3. The front-side conductive paste of claim 1, further comprises no more than 5% of an oxide of one or more elements selected from titanium, aluminum, silver, chromium, scandium, copper, niobium, vanadium, sodium, tantalum, strontium, bromine, cobalt, hafnium, lanthanum, yttrium, ytterbium, iron, barium, manganese, tungsten, nickel, tin, arsenic, zirconium, potassium, phosphorus, indium, gallium, and germanium.

4. The front-side conductive paste of claim 1, wherein the oxide etching agent comprises particles in at least one state of crystalline and amorphous, or mix of the crystalline and amorphous.

5. The front-side conductive paste of claim 1, wherein the metal powder comprises particles of silver, and one or more elements selected from gold, platinum, copper, iron, nickel, zinc, titanium, cobalt, chromium, aluminum, manganese, palladium, and rhodium.

6. The front-side conductive paste of claim 1, wherein the metal powder comprises particles of at least one element selected from copper, iron, nickel, zinc, titanium, cobalt, chromium, aluminum, and manganese, wherein each of the particles is coated by a silver layer having a thickness of 10-50 nm.

7. The front-side conductive paste of claim 1, wherein the metal powder comprises a mixture of non-silver-coated particles and silver-coated particles with a weight ratio in a range from 5/95 to 95/5, wherein the non-silver-coated particles comprise silver and one or more elements selected from gold, platinum, copper, iron, nickel, zinc, titanium, cobalt, chromium, aluminum, manganese, palladium, and rhodium, and the silver-coated particles comprise at least one element selected from copper, iron, nickel, zinc, titanium, cobalt, chromium, aluminum, and manganese, each of the silver-coated particles is coated by a silver layer having a thickness of 10-200 nm.

8. The front-side conductive paste of claim 1, wherein the organic carrier comprises, based on 100 parts, 50-95 parts of an organic solvent, 1-40 parts of a polymer, 0.1-10 parts of a wetting dispersant, 1-20 parts of a thixotropic agent, and 0.1-20 parts of a functional additive.

9. The front-side conductive paste of claim 8, wherein the organic solvent is at least one of terpineol, ethylene glycol butyl ether acetate, ethylene glycol ethyl ether acetate, a dodecanol ester, diethylene glycol butyl ether, triethylene glycol butyl ether, tripropylene glycol methyl ether, and a terpene;

wherein the polymer is at least one selected from ethyl cellulose, methyl cellulose, cellulose and a derivative thereof, an acrylic resin, an alkyd resin, and a polyester resin;

wherein the wetting dispersant is one or a mixture of one or two or more selected from a fatty acid, an amide derivative of a fatty acid, an ester derivative of a fatty acid, polyethylene wax, and polyethylene glycol;

wherein the thixotropic agent is at least one selected from a hydrogenated castor oil derivative, polyamide wax, polyurea, and fumed silica;

wherein the functional additive is one or two or more selected from poly (methylphenyl) siloxane, polyphenylsiloxane, a phthalate, diethyl phthalate, dibutyl phthalate, micro-crystalline wax, polydimethylsiloxane, polyvinylbutyral, a polyether- and polyester-modified organosiloxane, and an alkyl-modified organosiloxane.

10. A method for using a front-side conductive paste to form a front-side electrode for a crystalline silicon solar cell comprising:

providing a crystalline silicon solar cell chip having a front side of silicon covered by an insulating film;

screen printing the front-side conductive paste over the insulating film, the front-side conductive paste comprising, based on 100 parts by weight, 82.0-93.0 parts of a metal powder;

6.0-13.0 parts of an organic carrier;

1.0-5.0 parts of an oxide etching agent, wherein based on 100% by mole, the oxide etching agent comprises at least 10-40% of MgO, 0.1-5.0% of $B_2O_3$, 0.1-5% of PbO, and 5.0~30.0% of $Li_2O$;

heating the crystalline silicon solar cell chip to melt the oxide etching agent to a liquid contacted with the metal powder to dissolve the metal powder therein while evaporate the organic carrier, the oxide etching agent liquid with dissolved metal powder further etching through the insulating film to form a sintering bond with the front side of silicon; and cooling the crystalline silicon solar cell chip to turn the oxide etching agent liquid to a high-resistivity solid layer with the dissolved metal powder being precipitated out to form fine metal nanoparticles around the sintering bond between the metal and the front side of silicon with a good ohmic contact and a strong metal-silicon adhesion characterized by a lateral tensile force greater than 4 Newtons per 1 mm width.

11. The method of claim 10, further comprising drying the front-side conductive paste overlying the insulating film at a temperature in a range of 80-400° C. after screen printing.

12. The method of claim 10, wherein the heating is conducted at a temperature range of 700-820° C.

13. The method of claim 10, wherein the cooling is conducted naturally in flowing air at room temperature.

14. The method of claim 10, wherein the insulating film comprises one selected from a silicon nitride film, a titanium oxide film, an aluminum oxide film, and a silicon oxide film.

15. The method of claim 10, wherein the metal nanoparticles around the sintering bond form a front-side electrode characterized by a serial resistance smaller than 0.02 Ohm.

16. The method of claim 15, further comprising characterizing the front-side electrode by measuring the lateral tensile force using a tensile tester to pill off the front-side electrode at 180 degrees.

17. A crystalline silicon solar cell chip comprising:

a crystalline silicon chip;

an insulating film overlaid on a front side of the crystalline silicon chip;

a front-side electrode formed using the method of claim 10 to having metal nanoparticles around the sintering bond through the insulating film on the front side of the crystalline silicon chip.

18. The crystalline silicon solar cell chip of claim 17, wherein the insulating film comprises one of a silicon nitride film, a titanium oxide film, an aluminum oxide film, and a silicon oxide film.

19. The crystalline silicon solar cell chip of claim 17, wherein the front-side electrode comprises a good Ohmic contact with the front side of the crystalline silicon chip characterized by a seral resistance smaller than 0.02 Ohm.

20. The crystalline silicon solar cell chip of claim 17, wherein the front-side electrode comprises a strong mechanical adhesion with the front side of the crystalline silicon chip evident by inability of pilling off with a lateral tensile force smaller than 4 Newtons per 1 mm width.

* * * * *